United States Patent [19]

Okumura

[11] Patent Number: 5,680,069
[45] Date of Patent: Oct. 21, 1997

[54] DRIVER/RECEIVER CIRCUIT INCLUDING RECEIVER CIRCUIT WITH P-CHANNEL MOSFET AND N-CHANNEL MOSFET

[75] Inventor: Koichiro Okumura, Tokyo, Japan

[73] Assignee: NEC Corporation, Tokyo, Japan

[21] Appl. No.: 634,707

[22] Filed: Apr. 18, 1996

Related U.S. Application Data

[62] Division of Ser. No. 365,450, Dec. 28, 1994, Pat. No. 5,543,744.

[30] Foreign Application Priority Data

Dec. 28, 1993 [JP] Japan .................. 5-337164

[51] Int. Cl.$^6$ .................................................. H03L 5/00
[52] U.S. Cl. ........................ 327/333; 326/62; 326/81
[58] Field of Search .......................... 327/108–112, 170, 327/333, 374–377, 427, 434, 437; 326/21, 27, 62, 68, 80–83

[56] References Cited

U.S. PATENT DOCUMENTS

| | | | |
|---|---|---|---|
| 4,634,894 | 1/1987 | Shu et al. | 327/108 |
| 4,686,383 | 8/1987 | Croft | 327/434 |
| 4,717,847 | 1/1988 | Nolan | 326/65 |
| 4,970,414 | 11/1990 | Ruth, Jr. | 326/84 |
| 5,258,663 | 11/1993 | Tamaki | 327/437 |
| 5,293,082 | 3/1994 | Bathaee | 327/108 |
| 5,332,935 | 7/1994 | Shyu | 326/71 |
| 5,378,932 | 1/1995 | Shin et al. | 327/333 |
| 5,414,375 | 5/1995 | Tsuboi | 326/30 |

*Primary Examiner*—Timothy P. Callahan
*Assistant Examiner*—Kenneth B. Wells
*Attorney, Agent, or Firm*—Whitham, Curtis, Whitham & McGinn

[57] ABSTRACT

In order to rapidly transmit a signal between circuit blocks which are located apart from each other, there is provided a driver circuit for outputting a suitable small amplitude signal and a receiver circuit receiving the small amplitude signal to restore a large amplitude signal. The driver circuit 1 is configured to output, at a node C, a signal which is in a phase opposite to that of an input signal and which changes between a power supply potential and an intermediate potential determined by an inverter circuit 102, and at a node F, a signal which is also in the phase opposite to that of the input signal and which changes between a ground potential and the intermediate potential determined by an inverter circuit 106. A receiver circuit 2 phase-inverts these signals to restore at an output terminal O a signal changing between the power supply potential and the ground potential. Since the signal amplitude is small at the lines connected between the driver circuit 1 and the receiver circuit where the wiring capacitances $CL_1$ and $CL_2$, are large a signal transmission delay can be reduced.

13 Claims, 13 Drawing Sheets

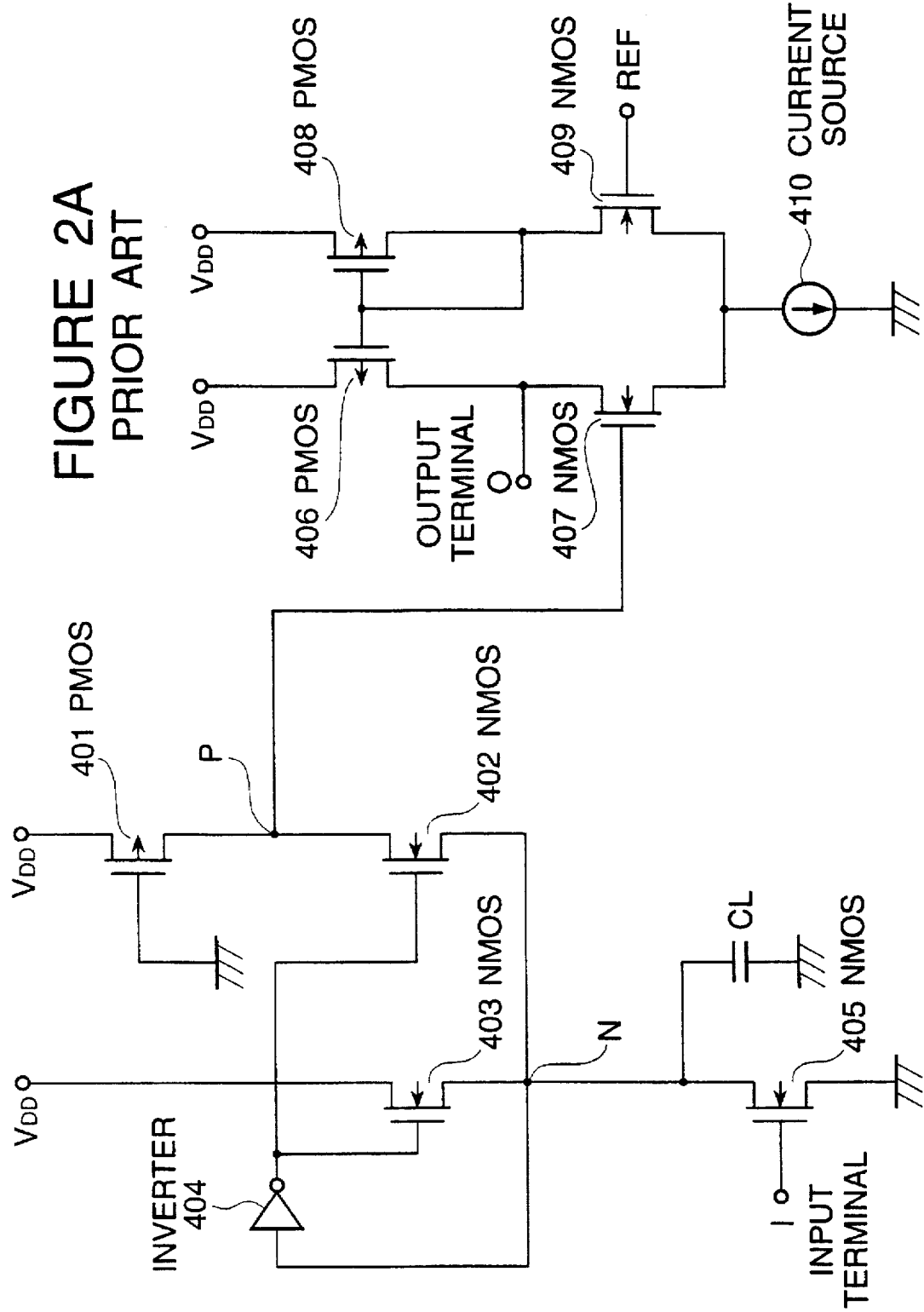

DRIVER/RECEIVER CIRCUIT INCLUDING RECEIVER CIRCUIT WITH P-CHANNEL MOSFET AND N-CHANNEL MOSFET

This is a Divisional Application of application Ser. No. 08/365,450 filed Dec. 28, 1994 now U.S. Pat. No. 5,543,744.

BACKGROUND OF THE INVENTION

1. Field of the Invention

The present invention relates to a driver/receiver circuit, and more specifically to a driver/receiver circuit comprising a driver circuit for driving a large capacitance with a small amplitude and a receiver circuit receiving an output of the driver circuit for shaping it into a signal having a large amplitude.

2. Description of Related Art

Conventionally, when a signal line interconnecting two CMOS circuits has a large capacitance, for example, when the signal line is very long, the rising and a falling of an output signal of a driver side CMOS circuit is slow. In addition, since the signal has an amplitude changing between a power supply potential and a ground potential, there was a problem that a signal transmission to a receiver side CMOS circuit took a long time. Now, the above mentioned problem of the CMOS circuit will be described with reference to FIG. 1A, which is a circuit diagram of a circuit in which each of a driver side circuit and a receiver side circuit is composed of a CMOS circuit. The driver side CMOS circuit 1 includes a P-channel MOSFET (called a "PMOS" hereinafter) 301 having its source connected to a power supply terminal VDD, its gate connected to an input terminal I and its drain connected to an output M of the driver side CMOS circuit 1, and an N-channel MOSFET (called a "NMOS" hereinafter) 302 having its source connected to a ground terminal, its gate connected to the input terminal I and its drain connected to the output M of the driver side CMOS circuit 1. The receiver side circuit 2 includes a PMOS 303 having its source connected to the power supply terminal VDD and its drain connected to an output O, and an NMOS 304 having its source connected to the ground terminal and its drain connected to the output O. Gates of the PMOS 303 and the NMOS 304 are interconnected to each other and electrically connected through a wiring. Reference Sign "CL" indicates a wiring capacitance. Both the driver side CMOS circuit 1 and the receiver side CMOS 2 function as an inverter circuit.

Next, with reference to FIG. 1B, a detailed explanation will be made as to why a delay is increased when the wiring between the driver side CMOS circuit 1 and the receiver side CMOS circuit 2 in the conventional circuit shown in FIG. 1A is long, because the wiring capacitance CL is large.

When an input signal at the input terminal I is a low level (ground level), a potential at the output terminal M of the driver side CMOS circuit 1 is at a high level (equivalent to a potential at the power supply terminal VDD), and a potential at the output terminal O of the receiver side CMOS circuit 2 is at the low level (ground level). When the input signal at the input terminal I is brought to the high level, the PMOS 301 is rendered non-conductive and the NMOS 302 is rendered conductive, so that the potential at the output terminal M of the driver side CMOS circuit 1 changes toward the ground potential in accordance with the time constant determined by a conduction resistance of the NMOS 302 and the wiring capacitance CL. The PMOS 303 of the receiver side CMOS circuit 2 changes from a non-conductive condition into a conductive condition, and the NMOS 304 of the receiver side CMOS circuit 2 changes from a conductive condition into a non-conductive condition. Here, ordinarily the receiver side CMOS circuit 1 has a circuit threshold on the order of a half of the power supply potential VDD, the potential on the output terminal O of the CMOS circuit 2 does not change until the potential of the output terminal M of the CMOS circuit 1 and the hence the gate potential of the PMOS 303 and the NMOS 304 lowers to a level less than the half of the power supply potential $V_{DD}$. Thereafter, the potential of the output terminal O changes toward the power supply potential $V_{DD}$, and then becomes the high level (a potential equal to the power supply potential $V_{DD}$). The output signal of the CMOS circuit 1 swings from the power supply potential to the ground potential, but since the circuit threshold of the CMOS circuit 2 is at a middle between the power supply potential $V_{DD}$ and the ground level, the signal transmission time from the CMOS circuit 1 to the CMOS circuit 2 is in proportion to a product of the power supply potential and the wiring capacitance CL. When the power supply potential is high and CL is large, the signal transmission needs a long time. Similarly, when the input signal at the input terminal I is brought from the high level to the low level, the PMOS 301 is rendered conductive and the NMOS 302 is rendered non-conductive, so that the potential at the output terminal M of the driver side CMOS circuit 1 changes from the low level (ground potential) toward the high level (power supply potential) in accordance with the time constant determined by a conduction resistance of the PMOS 301 and the wiring capacitance CL. When the potential at the output terminal M becomes higher than the circuit threshold of the CMOS circuit 2, the potential at the output terminal O of the CMOS circuit 2 changes from the high level (power supply potential) toward the low level (ground potential). In this case, the time of the signal transmission from the CMOS circuit 1 to the CMOS circuit 2 is in proportion to a product of the power supply potential and the wiring capacitance CL. Accordingly, in the conventional circuit shown in FIG. 1A, where the wiring capacitance CL is large, for example, when the CMOS circuit 1 and the CMOS circuit 2 are interconnected through a long wiring, the delay in the signal transmission is very large. This was a problem.

On the other hand, since the delay in the signal transmission is in proportion to the product of the signal amplitude and the wiring capacitance as mentioned above, it is possible to reduce the delay in the signal transmission by making the signal amplitude small. A circuit shown in FIG. 2A is a conventional example in which this conception has been applied in a sense circuit for use in a memory. In FIG. 2A, a PMOS 401 has its source connected to a power supply terminal $V_{DD}$, its gate connected to a ground terminal, and its drain connected to a node P. An NMOS 402 has its drain connected to the node P, its source connected to a node N, and another NMOS 403 has its drain connected to the power supply terminal $V_{DD}$ and its source connected to the node N. An inverter 404 has its input connected to the node N and its output connected to a gate of the NMOS 402 and a gate of the NMOS 403. An NMOS 405 has its drain connected to the node N, its gate connected to an input terminal I, and its source connected to ground.

In addition, a PMOS 406 has its source connected to the power supply terminal and its drain connected to an output terminal O, and an NMOS 407 has its drain connected to the output terminal. A PMOS 408 has its source connected to the power supply terminal $V_{DD}$, and its gate connected to a drain of the PMOS 408 itself and a gate of the PMOS 406. An NMOS 9 has its drain connected to the drain of the PMOS 408, and a current source 410 is connected between a source of each of the NMOS 407 and the NMOS 409 and a ground terminal. The PMOS 406, the NMOS 407, the PMOS 408, the NMOS 409 and the current source 410 constitute a sense circuit with a reference voltage REF applied to a gate of the NMOS 409. When a potential at the node P connected to a gate of the NMOS 407 is higher than the reference voltage REF, a signal of a low level is generated at the output terminal O, and when the potential at the node P is lower than the reference voltage REF, the signal of a high level is generated at the output terminal O. A capacitance CL indicates a capacitance attributable to a long metal wiring such as a digit line of a read only memory.

An operation of the circuit shown in FIG. 2A will be described with reference to a timing chart of FIG. 2B. When a signal on the input terminal I is at a low level, a potential difference between the output and the input of the inverter 404 is equal to a threshold voltage of the NMOS 402 and the NMOS 403. Namely, the potential difference balances at a turning point which just brings the NMOS 402 and the NMOS 403 conductive or non-conductive. Thus, the node N becomes an intermediate potential realizing the above mentioned condition, and the node P is becomes equal to a potential of the power supply terminal $V_{DD}$. As a result, the gate potential of the NMOS 407 is higher than the reference potential which is the gate potential of the NMOS 409, and therefore, the output terminal O becomes the high level. Next, when the signal on the input terminal I is brought from the low level to a high level, the NMOS 405 is rendered conductive, so that the potential on the node N drops. Therefore, the output potential of the inverter 404 receiving at its input the potential of the node N, namely, the gate potential of the NMOS 402 and the NMOS 403 elevates so that the NMOS 402 and the NMOS 403 are rendered conductive, and therefore, the potential on the node P quickly drops. When the potential of the node P becomes lower than the reference potential REF, the output terminal O changes to the high level. With the drop of the potential of the node N, the output of the inverter 404 elevates, and therefore, the conductive condition of the NMOS 403 becomes deep, so that a current flowing through the NMOS 403 from the power supply terminal $V_{DD}$ to the node N increases. Thus, the drop in the potential of the node N stops at such a potential that the current flowing through the NMOS 403 and through the PMOS 401 and the NMOS 402 to the node N balances with a current flowing through the NMOS 405 to the ground. Therefore, the low level of the node N also becomes an intermediate potential. Accordingly, by using an NMOSFET having a large channel width as the NMOS 403 and by using a PMOSFET having a small channel width as the PMOS 401, it is possible to make the difference between the high level and the low level at the node N, namely the signal amplitude very small. When the signal on the input terminal I is brought again to the low level from the high level, the NMOS 405 is rendered non-conductive, so that the potential on the node N elevates, and therefore, the output of the inverter 404 lowers. As a result, if the potential on the node N is brought to the high level, the current no longer flows either through the NMOS 402 or through the NMOS 403. Therefore, the node P is isolated from the node N having the large capacitance CL, so that the potential on the node P rapidly elevates. Since the amplitude of the node N from the low level to the high level is small, even if the capacitance CL of the digit line is large, it is possible to bring the NMOS 402 in a substantially non-conductive condition for a short time, so that the potential on the node P is isolated from the potential of the node N. In addition, if it is so designed that a parasitic capacitance of the node P is small, even if a current driving capacity of the PMOS 401 is relatively small, it is possible to quickly elevate the potential of the node P. When the potential of the node P becomes higher than the reference potential REF, the output terminal O is brought to the low level.

The conventional circuit shown in FIG. 2A has succeeded in realizing a high speed operation even if the capacitance CL of the digit line is large, by reducing the amplitude of the signal on the node N having a large capacitance. However, the conventional circuit shown in FIG. 2A is not suitable as a driver circuit for driving a long metal wiring connecting between circuit blocks formed on a semiconductor substrate. The reason for this is that, since a large wiring capacitance is added to a wiring extending between the node P and the gate of the NMOS 407 for interconnecting between the circuit blocks but the current driving capability of the PMOS 401 is small, the delay becomes extremely large. In addition, in order to cause a signal to vibrate with a small amplitude at an intermediate potential between the power supply potential and the ground potential, as in the signal on the node N in this conventional circuit, there is formed a DC current path from the power supply terminal $V_{DD}$ to the ground terminal (a path passing from $V_{DD}$ through the NMOS 403 and the NMOS 405 to the ground when the node N is at the low level). In addition, a current constantly flows in the sense circuit composed of the PMOS 406, the NMOS 407, the PMOS 408, the NMOS 409 and the current source 410. Accordingly, this is disadvantageous because of the large amount of electric power consumed.

As mention above, in the conventional circuit shown in FIG. 1A having the driver side circuit and the receiver side circuit each composed of the CMOS circuit, when the amplitude of the output signal of the driver side circuit is large, particularly when the wiring connecting between the driver side CMOS circuit and the receiver side CMOS circuit is long and therefore has a large capacitance, the time required for the signal to change to the circuit threshold of the receiver side CMOS circuit is long, and therefore, the delay in the signal transmission is large. In addition, the conventional circuit of FIG. 1A configured to reduce the signal amplitude in a large capacitance wiring, has such a problem that it is not suitable as the driver circuit, and the amount of consumed electric power is large.

SUMMARY OF THE INVENTION

Accordingly, it is an object of the present invention to provide a driver/receiver circuit which has overcome the above mentioned defects of the conventional ones.

Another object of the present invention is to provide a driver/receiver circuit having a small signal transmission delay and a small consumed electric power.

A driver/receiver circuit in accordance with the present invention comprises a driver circuit having a power supply terminal, a ground terminal, an input terminal and first and second output nodes, the driver circuit being configured to output, as the result of a logical operation for an input signal on the input terminal, on the first output node a first output signal which changes between a power supply potential supplied to the power supply terminal and a first potential, and on the second output node a second output signal which is in the same phase as that of the first output signal and which changes between a second potential and a ground potential; and a receiver circuit including a first electric circuit having at least a P-channel MOSFET connected between the power supply terminal and an output terminal and having its gate electrically first output node, first output node, and a second electric circuit having at least an N-channel MOSFET connected between the ground terminal and the output terminal and having its gate electrically connected to the second output node, the second electric circuit being constructed complementarily to the first electric circuit.

BRIEF DESCRIPTION OF THE DRAWINGS

FIG. 2A is a circuit diagram of another example of the conventional driver/receiver circuit;

DESCRIPTION OF THE PREFERRED EMBODIMENTS

Figure 3:
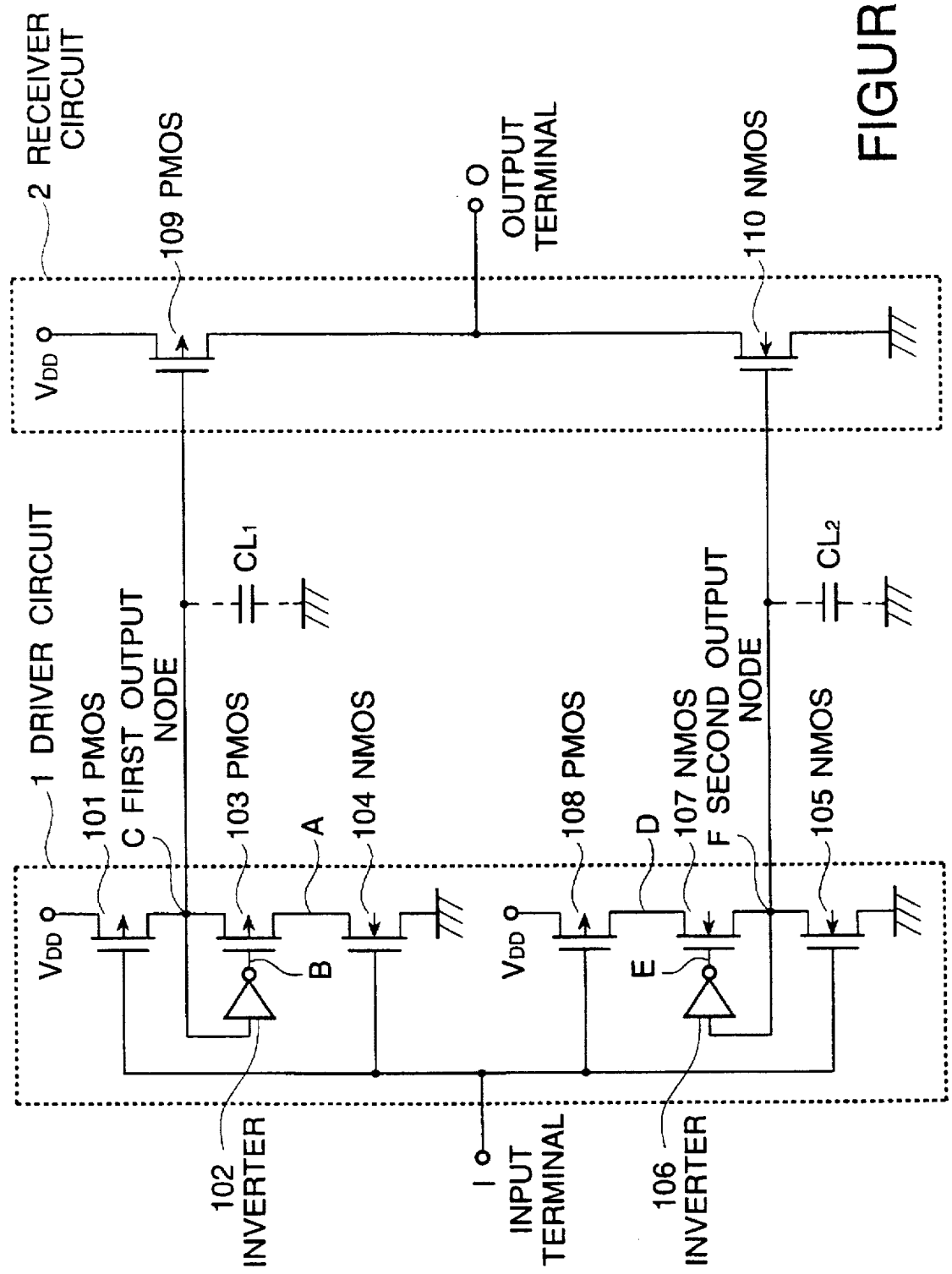
FIG. 3 is a circuit diagram of a first embodiment of the driver/receiver circuit in accordance with the present invention.

Now, the present invention will be described with reference to the drawings. FIG. 3 is a circuit diagram of a first embodiment of the present invention. In FIG. 3, a driver circuit 1 includes a PMOS 101 having its source connected to a power supply terminal $V_{DD}$, its gate connected to an input terminal I and its drain connected to a first output node C, an inverter circuit 102 having its input connected to the first output node C, the inverter circuit 102 constituting a first inverter circuit, a PMOS 103 having its source connected to the first output node C, its gate connected to an output B of the inverter circuit 102, and its drain connected to a node A, the PMOS 103 constituting a first voltage limiting MOSFET, and an NMOS 104 having its drain connected to the node A, its gate connected to the input terminal I and its source connected to a ground terminal. The driver circuit 1 also includes an NMOS 105 having its source connected to the ground terminal, its gate connected to the input terminal I and its drain connected to a second output node F, an inverter circuit 106 having its input connected to the second output node F, the inverter circuit 102 constituting a second inverter circuit, an NMOS 107 having its source connected to the second output node F, its gate connected to an output E of the inverter circuit 106, and its drain connected to a node D, the NMOS 107 constituting a second voltage limiting MOSFET, and a PMOS 108 having its drain connected to the node, its gate connected to the input terminal I and its source connected to the power supply terminal $V_{DD}$. A receiver circuit 2 includes a PMOS 109 having its source connected to the power supply terminal $V_{DD}$ and its drain connected to an output terminal O, and an NMOS 110 having its source connected to the ground terminal and its drain connected to the output terminal. A gate of the PMOS 109 is electrically connected to the first output node C of the driver circuit 1 through a long wiring, and similarly, a gate of the NMOS 110 is connected to the second output node F of the driver circuit 1 through a long wiring. Capacitances $CL_1$ and $CL_2$ indicate the capacitance of these wirings, respectively.

Figure 4:
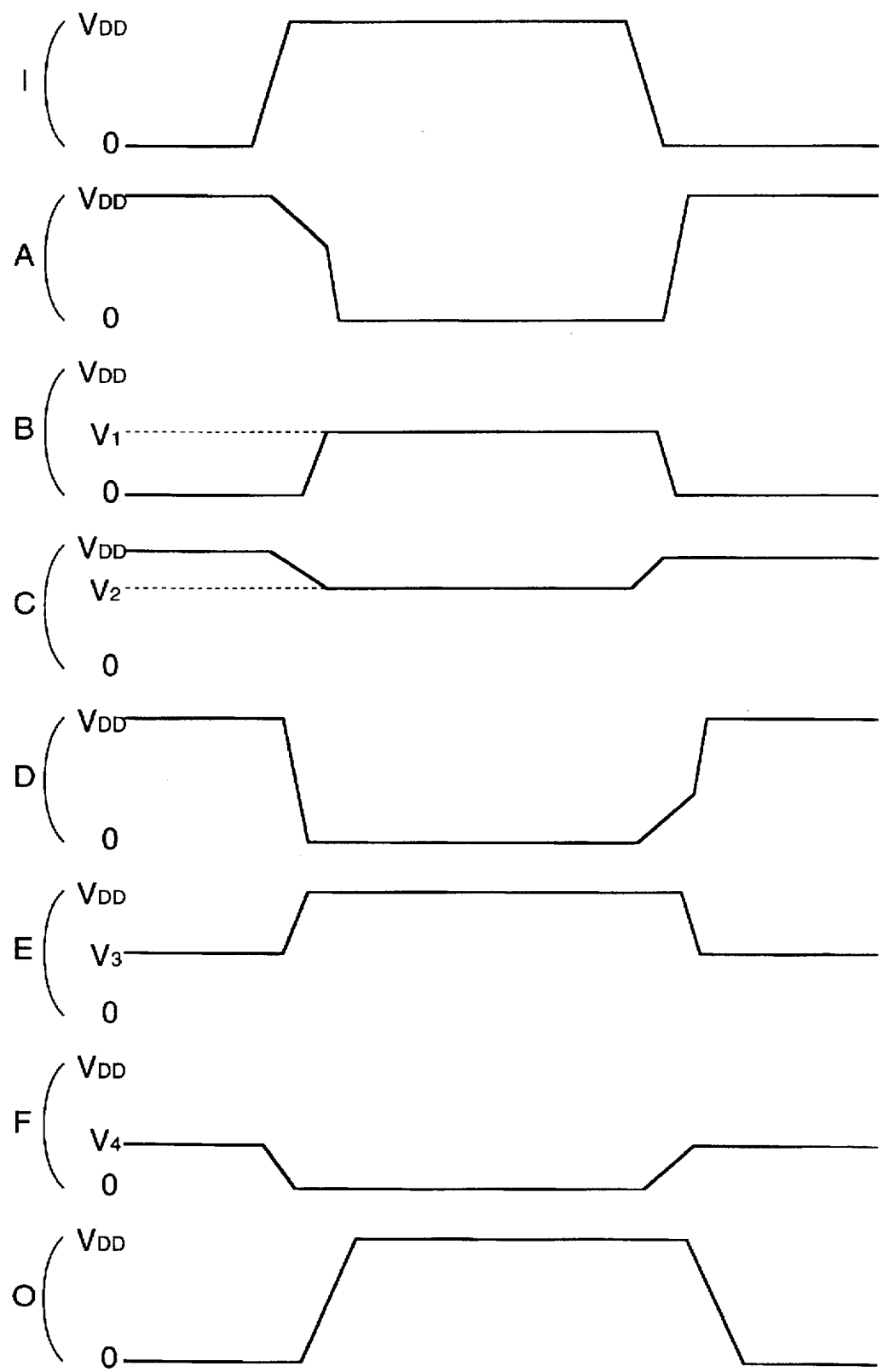
FIG. 4 is a timing chart illustrating an operation of the first embodiment of the driver/receiver circuit in accordance with the present invention shown in FIG. 3.

Next, operation of the driver circuit 1 and the receiver circuit 2 shown in FIG. 3 will be described in detail with reference to FIG. 4 showing a timing chart.

When a signal on the input terminal I is at a low level, the PMOS 101 is conductive, and the NMOS 104 is non-conductive. Therefore, a potential on the first output node C is equal to that of the power supply terminal $V_{DD}$. Therefore, since the output B of the inverter circuit 102 having its input connected to the first output node C becomes the ground potential, the PMOS 103 is rendered conductive, and the node A also becomes equal to $V_{DD}$. Similarly, since the PMOS 108 is conductive and the NMOS 105 is non-conductive, the node D becomes equal to $V_{DD}$. But, the NMOS 107 becomes non-conductive just at a such a potential of the second output node F which makes a potential difference between the second output node F (which is the input of the inverter circuit 106) and the output E of the inverter circuit 106, namely, a potential difference between the gate and the source of the NMOS 107, equal to a threshold voltage of the NMOS 107. Accordingly, the potential of the node F cannot elevate higher than such a potential, and is maintained at an intermediate potential $V_4$ as shown in FIG. 4.

As seen from the above, the potential of the output E of the inverter circuit becomes constant at a potential $V_3$ which is higher than the potential of the second output node F by the threshold voltage of the NMOS 107. Thus, when the signal on the input terminal I is at the low level, the first output node C of the driver circuit 1 is equal to the potential on the power supply terminal $V_{DD}$ and the potential of the second output node F is at the intermediate potential $V_4$, so that the PMOS 109 of the receiver circuit 2 is non-conductive, and the NMOS 110 becomes conductive by setting $V_4$ higher than a threshold voltage of the NMOS 110. Accordingly, the potential of the output terminal O becomes the ground potential.

If the signal on the input terminal I changes from the low level to the high level, the PMOS 101 and the NMOS 104 in the driver circuit 1 will become non-conductive and conductive, respectively. In this process, initially, since the potential on the first output node C is close to the potential on the power supply terminal $V_{DD}$, the output C of the inverter circuit 2 is close to the ground potential, and therefore, the PMOS 103 is maintained in a conductive condition. Thus, an electric charge of the wiring capacitance $CL_1$ is discharged through the PMOS 103 and the NMOS 104, so that the potential of the first output node C and the potential of the node A drop with substantially the same time constant, as shown in FIG. 4. However, since the potential of the first output node C drops on one hand and the output B of the inverter circuit 102 receiving at its input the potential of the first output node C elevates on the other hand, the PMOS 103 becomes non-conductive when a voltage difference between the nodes C and B becomes equal to a threshold of the PMOS 103. Thus, the potential on the first output node C stops its voltage drop at an intermediate potential $V_2$ and is maintained at a constant potential.

In addition, when the PMOS 103 becomes non-conductive, the node A is isolated from the large wiring capacitance $CL_1$, and therefore, the potential drop of the node A becomes rapid, so that as shown in FIG. 4, the node A drops to the ground potential. The potential on the output B of the inverter circuit 102 becomes constant at a potential $V_1$ which is lower than the potential of the first output node C, namely, $V_2$, by the threshold voltage of the PMOS 103.

On the other hand, the potential on the second output node F changes to the ground potential, because the PMOS 108 and the NMOS 105 are rendered non-conductive and conductive, respectively, so that the electric charge on the large wiring capacitance $CL_2$ is discharged through the NMOS 105. Since the potential on the output E of the inverter circuit 106 elevates towards the potential of the power supply terminal $V_{DD}$ because of the change in potential on the node F, the potential difference between the gate and the source of the NMOS 107 becomes large, so that the NMOS 107 is put into a conductive condition, with the result that the potential of the node D follows up the potential change of the output node F so as to change to the ground potential.

In the receiver circuit, since the potential of the second output node F changes, the NMOS 110 is rendered non-conductive. On the other hand, the potential of the first output node C changes from the potential of the power supply terminal $V_{DD}$ to $V_2$ as mentioned above, and therefore, by setting {$V_2$ minus the potential of the $V_{DD}$ terminal} smaller than a threshold voltage (negative) of the PMOS 109, the PMOS 109 is rendered conductive when the gate potential of the PMOS 109 becomes $V_2$, so that the potential of the output terminal O is quickly elevated to the potential of the power supply terminal $V_{DD}$.

Next, operation when the signal on the input terminal I changes from the high level to the low level again, will be explained. Since the PMOS 101 and the NMOS 104 are rendered conductive and non-conductive, respectively, the capacitance CL1 is charged through the PMOS 101, and the potential of the first output node C elevates to the potential of the power supply terminal $V_{DD}$. The potential of the output B of the inverter circuit 102 drops to the ground potential because of the potential elevation of the first output node C, so that the PMOS 103 is rendered conductive, and therefore, the potential of the node A follows the potential change of the first output node C so as to elevate to the potential of the power supply terminal $V_{DD}$. On the other hand, since the PMOS 108 and the NMOS 105 are rendered conductive and non-conductive, respectively, the potential of the second output node F elevates, but since the potential of the output E of the inverter circuit 106 drops because of the elevation of the potential of the second output node F, the NMOS 107 is rendered non-conductive when the potential of the second output node F reaches $V_4$. Therefore, the potential of the second output node F is maintained at $V_4$. The potential of the node E stops its drop at $V_3$ which is higher than $V_4$ by the threshold voltage of the NMOS 107, and becomes constant at $V_4$. The potential of the node D elevates to a potential substantially equal to the potential of the second output node F because the wiring capacitance $CL_2$ is initially charged through the PMOS 108 and the NMOS 107, but when the NMOS 107 is rendered non-conductive, the node D is isolated from the large wiring capacitance $CL_2$, so that the potential of the node D rapidly elevates toward the potential of the power supply terminal $V_{DD}$.

In the receiver circuit, since the potential of the first output node C changes to the potential of the power supply terminal $V_{DD}$, the PMOS 109 is rendered non-conductive. Since the potential of the second output node F changes to $V_4$, the NMOS 110 is rendered conductive, so that the potential of the output terminal O quickly drops to the ground potential.

Figure 2B:
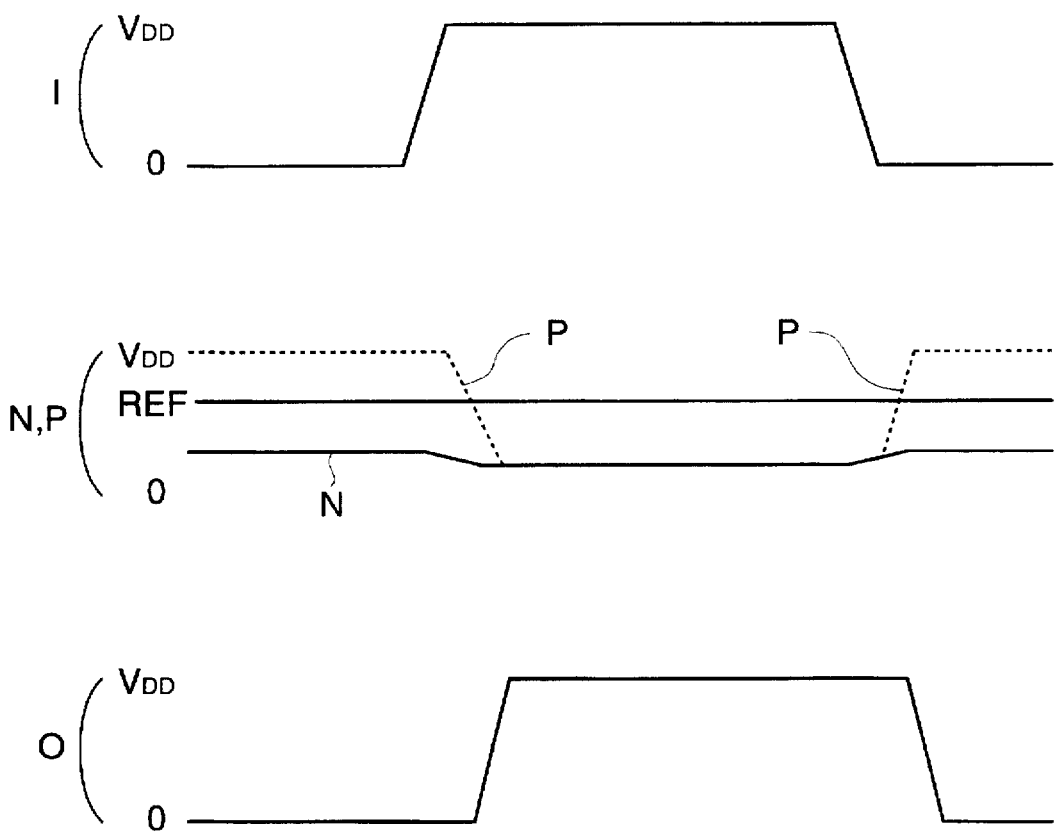
FIG. 2B is a timing chart illustrating an operation of the conventional driver/receiver circuit shown in FIG. 2A.

As mentioned above, the driver/receiver circuit shown in FIG. 3 is so configured that the signal amplitude of the first output node C is so small that the high level is the potential of the power supply terminal $V_{DD}$ and the low level is $V_2$, and also the signal amplitude of the second output node F is so small that the high level is $V_4$ and the low level is the ground level. In addition, when the receiver circuit 2 receives the high level input, the PMOS 109 is quickly rendered non-conductive, so that the circuit threshold becomes substantially equal to the threshold voltage of the NMOS 110. Similarly, when the receiver circuit 2 receives the low level input, the NMOS 110 is quickly rendered non-conductive, so that the circuit threshold becomes substantially equal to the threshold voltage of the PMOS 109. Accordingly, even if the wiring capacitances $CL_1$ and $CL_2$ are large, the time of the signal transmission from the driver circuit to the receiver circuit 2 can be shortened, with the result that the time of the signal transmission from the input terminal I to the output terminal O can be correspondingly shortened. Since the regularly flowing current includes only the current flowing in the inverter 102 when the potential of the first output node C is at $V_2$ (low level) and the current flowing in the inverter 106 when the potential of the second output node F is at $V_4$ (high level), the consumed electric power is remarkably small in comparison with the conventional example shown in FIG. 2A.

In the circuit shown in FIG. 3, the amount of electric charges for charging and discharging the wiring capacitances $CL_1$ and $CL_2$, is expressed as $(V_{DD}-V_2) \times CL_1 + V_4 \times CL_2$. By making $V_2$ not lower than $V_{DD}/2$ and making $V_4$ not higher than $V_{DD}/2$, namely, by making the signal amplitude of each of the first and second output nodes, respectively, not lower than and not larger than $V_{DD}/2$, the total amount of the charging and discharging electric charges can be made smaller than the conventional circuit shown in FIG. 1A. In addition, the increase of the amount of consumed electric power due to the simultaneous conduction of the PMOS 109 and the NMOS 110 in a transient condition can be prevented. Therefore, the amount of consumed electric power can be substantially made smaller than that of the conventional circuit shown in FIG. 1A.

In the circuit shown in FIG. 3, the potential $V_2$ of the low level on the first output node C can be easily set to a desired value by adjusting the circuit threshold of the inverter circuit 102, namely, by adjusting, when the inverter 102 is composed of a CMOS circuit, respective channel widths of the PMOS and the NMOS. Namely, when it is desired to set $V_2$ at a level close to $V_{DD}$, it is sufficient if the channel width W of the PMOS is made ten times to twenty times the channel width of the NMOS. To the contrary, if it is desired to set $V_2$ at a relatively low intermediate potential, it is sufficient if the channel width W of the PMOS is made three times to ten times the channel width of the NMOS. Similarly, the potential $V_4$ of the low level on the second output node F can be easily set by adjusting the circuit threshold of the inverter circuit 106. When the inverter 106 is composed of a CMOS circuit, if the channel width W of the NMOS is made sufficiently larger than that of the PMOS, $V_4$ can be made near to the ground potential.

Furthermore, as mentioned above, the signal amplitude of the first output node C and the signal amplitude of the second output node F are determined by the circuit threshold of the inverter circuits 102 and 106, but do not depend upon respective thresholds of the NMOSs the PMOSs included in the circuit shown in FIG. 3. Accordingly, by setting the thresholds of the NMOSs the PMOSs at a small value in an absolute value, it is possible to further speed up the operation of the receiver circuit without losing the advantage of the present invention.

For example, when the amplitude of the first and second output nodes is set as small as 1 V, if the absolute value of the threshold of the PMOSs and the NMOSs is set at 0.7 V and at 0.3 V, respectively, the receiver circuit having the latter threshold operates three times as fast as that of the receiver circuit having the former threshold.

Figure 5:
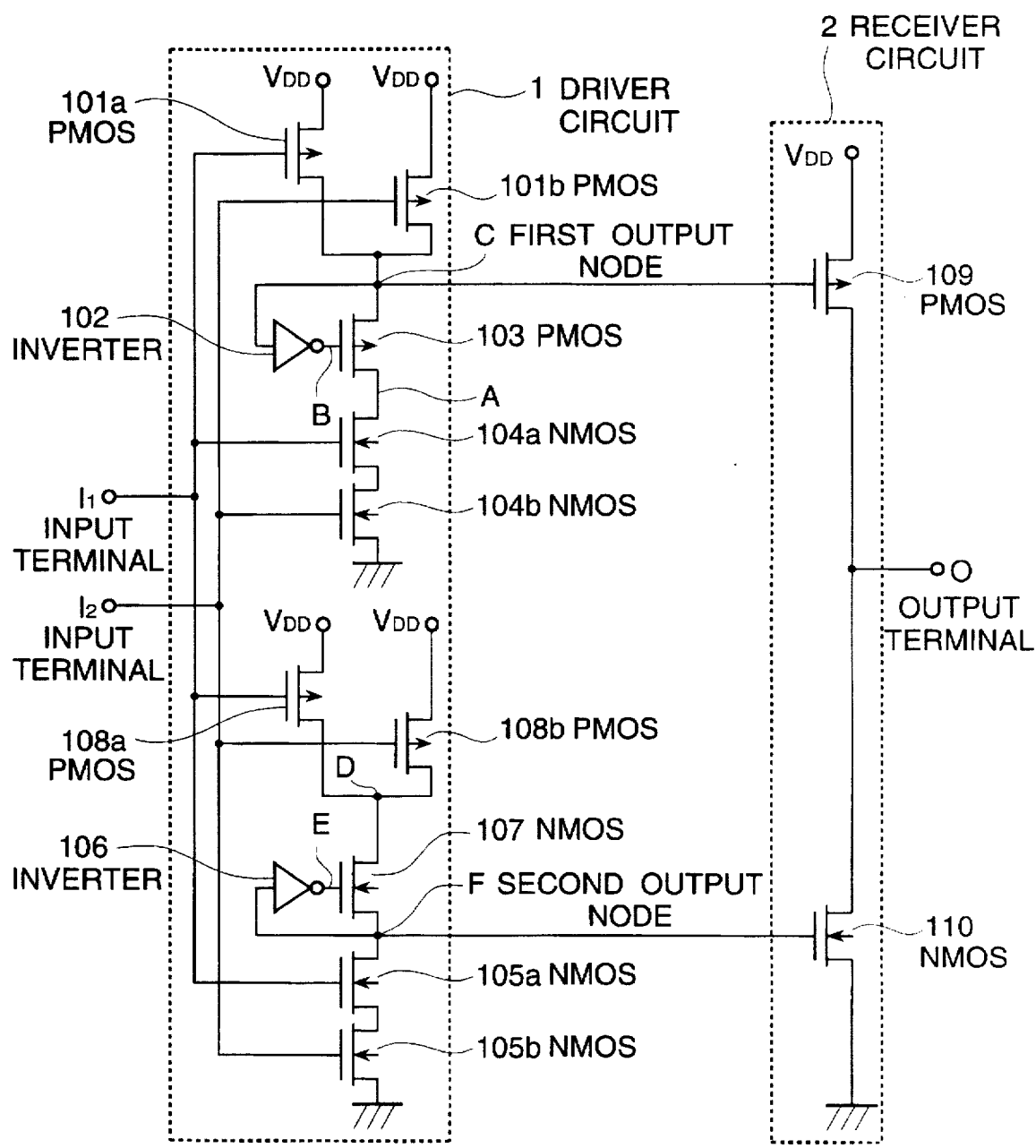
FIG. 5 is a circuit diagram of a second embodiment of the driver/receiver circuit in accordance with the present invention.

FIG. 5 is a circuit diagram of the second embodiment of the present invention. A difference between FIG. 3 already explained above and FIG. 5 is that the PMOS 101, the NMOS 104, the PMOS 108 and the NMOS 105 shown in FIG. 3 are replaced, in FIG. 5, with a parallel connection of PMOS 101a and PMOS 101b, a series connection of NMOS 104a and NMOS 104b, a parallel connection of PMOS 108a and PMOS 108b, and a series connection of NMOS 105a and 105b, respectively, and respective gates of the PMOS 101a, the NMOS 104a, the PMOS 108a and the NMOS 105a are connected to a first input terminal $I_1$, and respective gates of the PMOS 101b, the NMOS 104b, the PMOS 108b and the NMOS 105b are connected to a second input terminal $I_2$. In the circuit shown in FIG. 5, only when both the inputs $I_1$ and $I_2$ are at a high level, is the first output node C brought to the potential of $V_2$ in FIG. 4, and the potential of the second output node F is brought to the ground potential. Namely, both the output nodes are brought to the low level. When at least one of the inputs $I_1$ and $I_2$ are at a low level, the first output node C is brought to the potential of the power supply terminal $V_{DD}$, and the potential of the second output node F is brought to the potential of $V_4$ in FIG. 4. Namely, both the output nodes are brought to the high level. Accordingly, the circuit shown in FIG. 5 is a two-input NAND circuit expanded from the circuit shown in FIG. 3. An explanation of an operation will be omitted, since it is the same as the explanation made with reference to FIGS. 3 and 4, excepting that the circuit operates as the NAND circuit.

As mentioned above, FIG. 5 shows an example in which the driver circuit of the driver/receiver circuit in accordance with the present invention is constructed in the form of a two-input NAND circuit. The driver circuit of the present invention can have a logic function other than the two-input NAND. For an "n"-input NAND, "n" PMOS transistors may be connected in parallel to each other between the power supply terminal $V_{DD}$ and the first output node C, and a circuit complementary to these parallel-connected PMOS transistors, namely, "n" NMOS transistors may be connected in series between the node A and the ground terminal. Furthermore, "n" PMOS transistors may be connected in parallel to each other between the power supply terminal $V_{DD}$ and the node D, and a circuit complementary to these parallel-connected PMOS transistors, namely, "n" NMOS transistors may be connected in series between the second output terminal F and the ground terminal. Similarly, for an "n"-input NOR, "n" PMOS transistors may be connected in series between the power supply terminal $V_{DD}$ and the first output node C, and a circuit complementary to these series-connected PMOS transistors, namely, "n" NMOS transistors may be connected in parallel between the node A and the ground terminal. Furthermore, "n" PMOS transistors may be connected in series between the power supply terminal $V_{DD}$ and the node D, and a circuit complementary to these series-connected PMOS transistors, namely, "n" NMOS transistors may be connected in parallel between the second output terminal F and the ground terminal.

Figure 6:
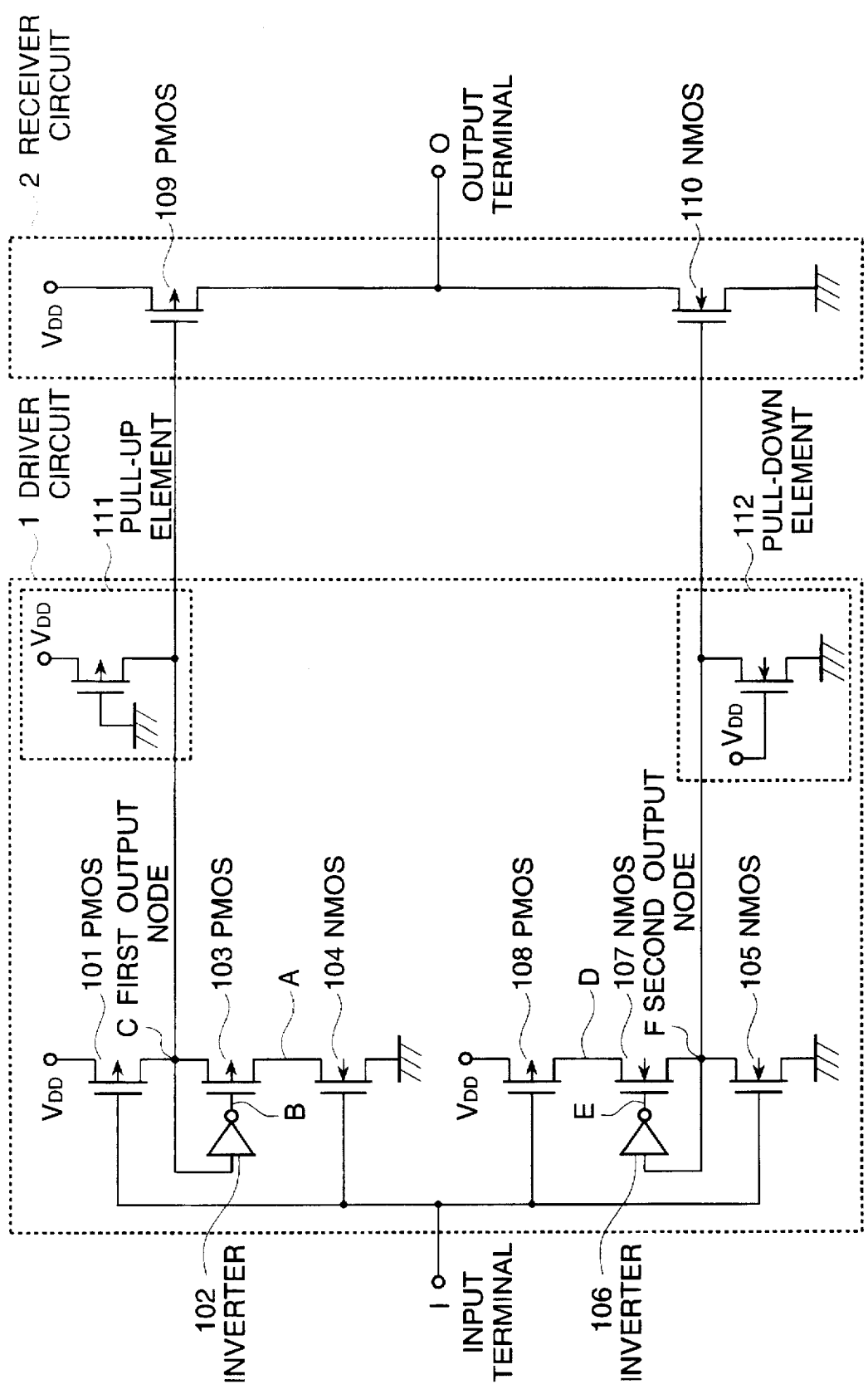
FIG. 6 is a circuit diagram of a third embodiment of the driver/receiver circuit in accordance with the present invention.

FIG. 6 shows a third embodiment. The circuit shown in FIG. 6 is the same as the circuit shown in FIG. 3, except that, in FIG. 5, there are provided a pull-up element 111 formed of a PMOS having its drain connected to the first output node C of the driver circuit 1, its gate connected to the ground and its source connected to the power supply terminal $V_{DD}$, and a pull-down element 112 formed of an NMOS having its drain connected to the second output node F, its gate connected to the power supply terminal $V_{DD}$ and its source connected to ground.

In the circuit shown in FIG. 3, the potential of the low level of the first output node C, namely, the potential of $V_2$ in FIG. 4, has a recovery function against the voltage variation toward to a high voltage, but does not have a recovery function against the voltage variation toward to a low voltage. Namely, if the potential of the first output node C becomes higher than $V_2$ for any cause, the output potential of the inverter circuit 102 drops so that the PMOS 102 is rendered conductive so as to pull down the potential of the first output node C back to $V_2$. However, when the potential of the first output node C becomes lower than $V_2$ for any cause, since there is no means for charging the first output node C toward the potential of the power supply terminal $V_{DD}$, the potential of the first output node C cannot be restored in the circuit shown in FIG. 3. Similarly, when the potential of the second output node F varies toward a level lower than $V_4$ in FIG. 4, since the output potential of the inverter circuit 106 elevates so as to render the NMOS 107 conductive, so that the potential of the second output node F is returned to $V_4$. When the potential of the second output node F varies toward a level higher than $V_4$, since there is no means for discharging the second output node F toward the ground potential, the potential of the second output node F cannot be restored in the circuit shown in FIG. 3.

In the embodiment shown in FIG. 6, however, since there is provided a charging path passing from the power supply terminal $V_{DD}$ to the first output node C through the pull-up element 111 is constantly maintained in the conductive condition, when the potential of the first output node C becomes lower than $V_2$, the potential of the first output node C can be recovered. Similarly, since there is provided a discharging path passing from the second output node F to the ground terminal through the pull-down element 112 is constantly maintained in the conductive condition, when the potential of the second output node F becomes higher than $V_4$, the potential of the second output node F can be recovered. Since it is sufficient if the pull-up element 111 and the pull-down element 112 can charge and discharge with a minute current, it is sufficient if the pull-up element 111 and the pull-down element 112 have a small current driving capability. Influence to increase the consumed electric power can be made small. In addition, it is a matter of course that it can be similarly applied to the multi-input driver circuit shown in FIG. 5.

Figure 7A:
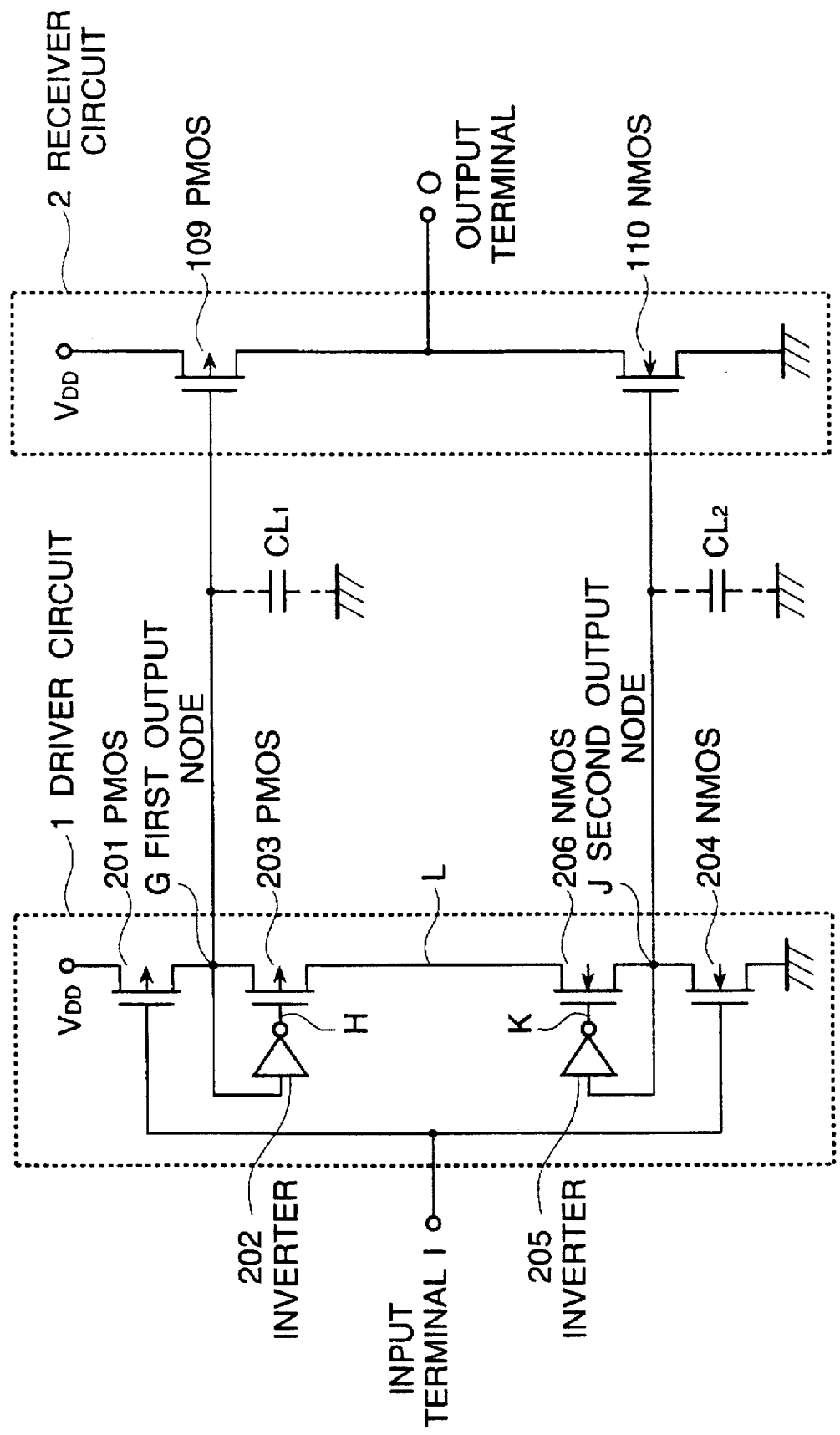
FIG. 7A is a circuit diagram of a fourth embodiment of the driver/receiver circuit in accordance with the present invention.
Figure 7B:
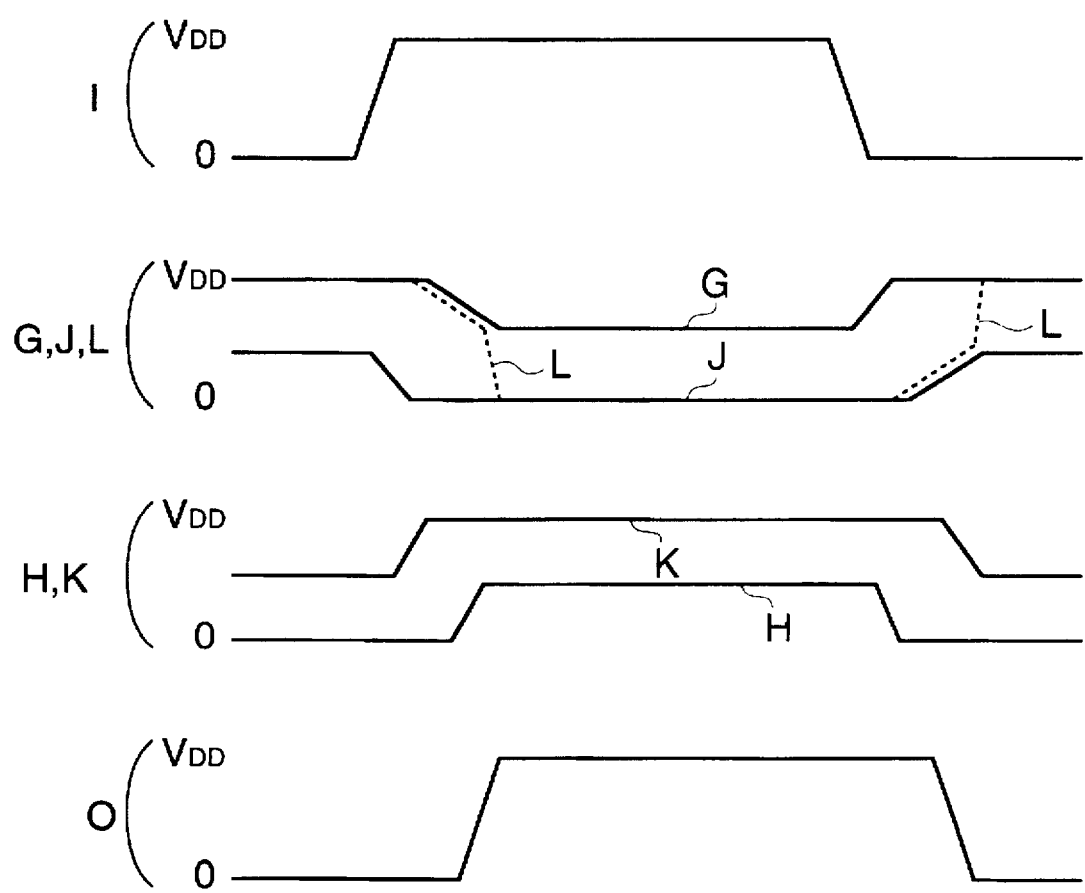
FIG. 7B is a timing chart illustrating an operation of the fourth embodiment of the driver/receiver circuit in accordance with the present invention shown in FIG. 7A.

FIG. 7A is a circuit diagram of a fourth embodiment of the present invention, and FIG. 7B is a timing chart of an operation thereof. In FIG. 7A, a driver circuit 1 includes a PMOS 201 having its source connected to a power supply terminal $V_{DD}$, its gate connected to an input terminal I and its drain connected to a first output node G, an inverter circuit 202 having its input connected to the first output node G, the inverter circuit 202 constituting a first inverter circuit, a PMOS 203 having its source connected to the first output node G, its gate connected to an output H of the inverter circuit 202, and its drain connected to a node L. The driver circuit 1 also includes an NMOS 204 having its source connected to the ground terminal, its gate connected to the input terminal I and its drain connected to a second output node J, an inverter circuit 205 having its input connected to the second output node J, the inverter circuit, 205 constituting a second inverter circuit, an NMOS 206 having its source connected to the second output node J, its gate connected to an output K of the inverter circuit 205, and its drain connected to the node L. A receiver circuit 2 is the same as that shown in FIG. 3. Namely, the receiver circuit 2 includes a PMOS 109 having its source connected to the power supply terminal $V_{DD}$ and its drain connected to an output terminal O, and an NMOS 110 having its source connected to the ground terminal and its drain connected to the output terminal O. A gate of the PMOS 109 is electrically connected to the first output node G through a wiring having a large capacitance $CL_1$, and similarly, a gate of the NMOS 110 is connected to the second output node J through a wiring having a large capacitance $CL_2$.

Next, a circuit operation of the embodiment shown in FIG. 7A will be described in detail with reference to FIG. 7B. When a signal on the input terminal I is at a low level, the PMOS 201 is conductive, and the NMOS 204 is non-conductive. Therefore, a potential on the first output node G is equal to that of the power supply terminal $V_{DD}$. Accordingly, since the output H of the inverter circuit 202 becomes the ground potential, the PMOS 203 is rendered conductive, and the node L becomes equal to $V_{DD}$. On the other hand, since the NMOS 206 becomes non-conductive just at such a potential of the second output node J which makes a difference between the second output node J and the output K of the inverter circuit 205 equal to a threshold voltage of the NMOS 206. Accordingly, the potential of the node J is maintained at an intermediate potential which is the same as $V_4$ as shown in FIG. 4.

If the signal on the input terminal I changes from the low level to the high level, the PMOS 201 and the NMOS 204 will become non-conductive and conductive, respectively. In this process, initially, since the potential on the second output node J drops toward the ground potential, and the output K of the inverter circuit 205 correspondingly elevates toward the potential of the power supply terminal $V_{DD}$, the NMOS 206 is rendered conductive. Therefore, the potential of the node L starts to drop from the same level as the potential of the power supply terminal $V_{DD}$, but since the PMOS 203 is conductive in an initial stage, an electric charge of the wiring capacitance $CL_1$ is discharged through the PMOS 203, the NMOS 206 and the NMOS 204, so that the potential of the node L drops slowly. Thereafter, the potential of the first output terminal G lowers, and the output H of the inverter circuit 202 elevates its potential. When the difference between the first output terminal G and the output H of the inverter circuit 202 becomes equal to the threshold of the PMOS 203, the PMOS 203 is rendered non-conductive, so that the first output terminal G and the output H of the inverter circuit 202 stop their voltage change at intermediate potentials corresponding to $V_2$ and $V_1$ in FIG. 4, respectively. In addition, the node L is isolated from the first output node G added with the wiring capacitance, and therefore, rapidly drops and becomes the ground potential. As shown in FIG. 7B, since the potential of the first output node G becomes the intermediate potential, and since the potential of the second output node J becomes the ground potential, the PMOS 109 and the NMOS 110 in the receiver circuit 2 are rendered conductive and non-conductive, respectively, so that the potential of the output terminal O elevates toward the potential of the power supply terminal $V_{DD}$, in a similar manner to the embodiment of FIG. 3.

Next, when the signal on the input terminal I changes from the high level to the low level again, the PMOS 201 and the NMOS 204 in the driver circuit 1 are rendered conductive and non-conductive, respectively. Accordingly, the first output node G initially elevates from the intermediate potential to the potential of the power supply terminal $V_{DD}$, and the potential of the output H of the inverter circuit 202 correspondingly drop to the ground potential, so that the PMOS 203 is rendered conductive, and therefore, the potential of the node L starts to elevate. On the other hand, since the NMOS 206 is initially conductive, the potential of the second output terminal J starts to elevate. However, when the difference between the output K of the inverter circuit 205 and the second output node J becomes equal to the threshold voltage of the NMOS 206, the NMOS 206 becomes non-conductive. The potential elevation of the second output terminal J and the potential drop of the output K of the inverter circuit 205 stop, so that the second output terminal J and the output K of the inverter circuit 205 remain at intermediate potentials as shown in FIG. 7B. The potential elevation of the node L is slow when the NMOS 206 is conductive, but if the NMOS 206 becomes non-conductive, since the node L is isolated from the wiring capacitance $CL_2$, the potential of the node L quickly elevates. As a result, as shown in FIG. 7B, since the potential of the first output node G elevates toward the potential of the power supply terminal $V_{DD}$, and since the potential of the second output node J changes to the intermediate potential, the PMOS 109 and the NMOS 110 in the receiver circuit 2 are rendered non-conductive and conductive, respectively, so that the potential of the output terminal O drops toward the ground potential, in a similar manner to the embodiment of FIG. 3.

As mentioned above, the driver/receiver circuit of the embodiment shown in FIG. 7A operates in substantially the same manner as that of the circuit shown in FIG. 3. But, the circuit of the embodiment shown in FIG. 7A can be advantageously made of a small number of circuit elements than that of the elements required in the circuit of FIG. 3.

Incidentally, it is also advantageous if the signal amplitude of the first output node G and the second output node J is made not larger than $V_{DD}/2$ in order to reduce the consumed electric power. In addition, by adding the pull-up element and the pull-down element to the first output node G and the second output node J, respectively, it is possible to obtain a recovery effect for compensating the level variation on these nodes, similarly to the embodiment of FIG. 6.

Figure 8:
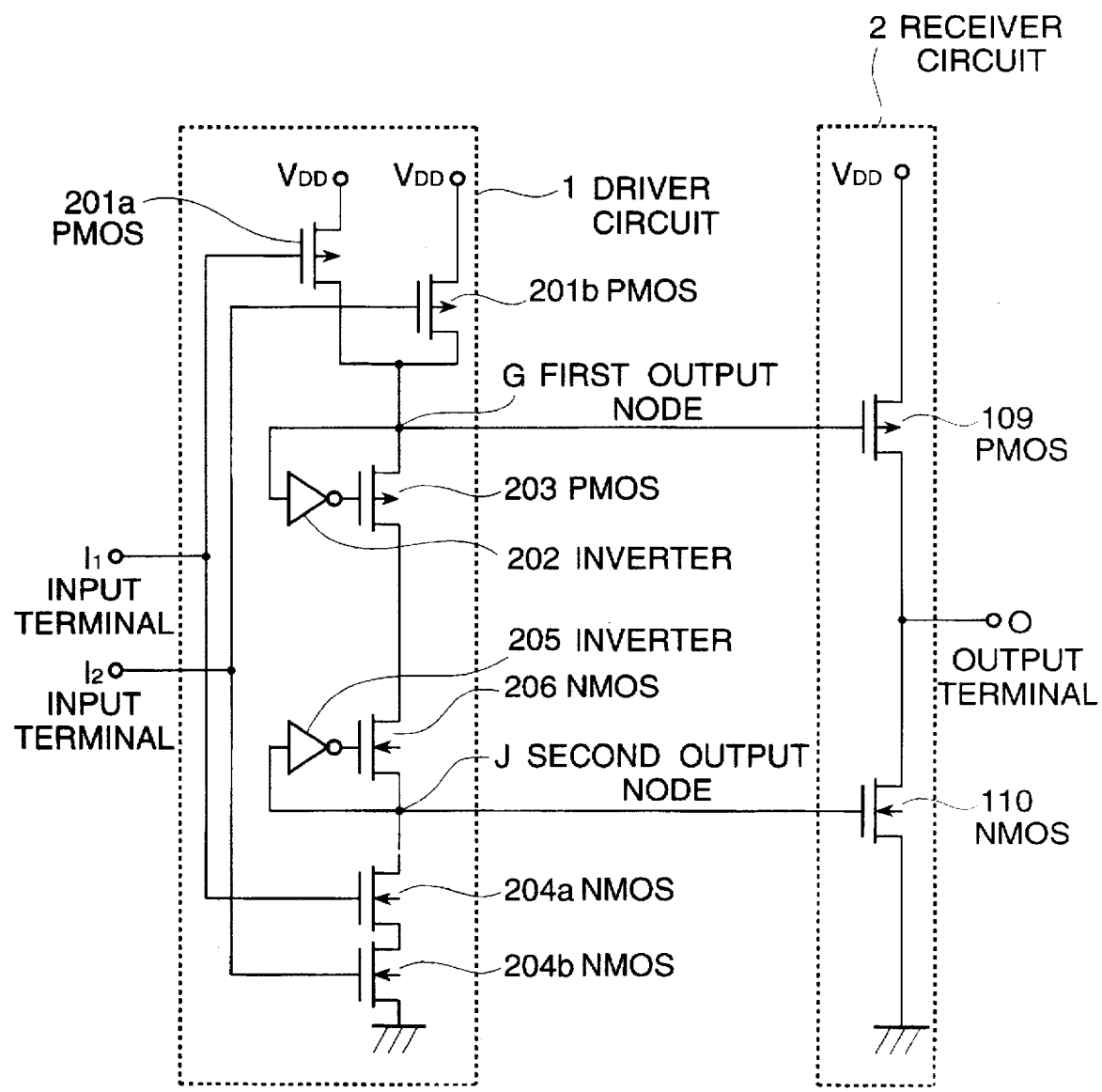
FIG. 8 is a circuit diagram of a fifth embodiment of the driver/receiver circuit in accordance with the present invention.

FIG. 8 is a circuit diagram of a fifth embodiment of the present invention. FIG. 8 shows an embodiment in which the driver circuit in the embodiment shown in FIG. 7A is expanded to a two-input NAND circuit. The PMOS 201 and the NMOS 204 in FIG. 7A are replaced with a parallel connection of PMOS 201a and PMOS 201b and a series connection of NMOS 204a and NMOS 204b, respectively. The other construction is the same as that shown in FIG. 7A. In the circuit shown in FIG. 8, only when both a first input $I_1$ and a second input $I_2$ are at a high level, both of the PMOS 201a and the PMOS 201b are non-conductive and both of the NMOS 204a and NMOS 204b are conductive, so that the first output node G is brought, as a low level, to the intermediate level between the potential of the $V_{DD}$ terminal and the ground potential, and the second output node J is brought to the ground potential which is the low level, in a similar manner to the case explained in connection with the embodiment shown in FIG. 7A. On the other hand, when at least one of the first input $I_1$ and the second input $I_2$ are at a low level, since at least one of the PMOS 201a and the PMOS 201b is conductive and at least one of the NMOS 204a and NMOS 204b is non-conductive, the first output node in the driver circuit 1 is brought to a potential equal to the potential of the power supply terminal $V_{DD}$, and the potential of the second output node J is brought, as a high level, to the intermediate potential between the potential of the power supply terminal $V_{DD}$ and the ground potential, similarly to the case explained in connection with the embodiment shown in FIG. 7A. Since the construction and the operation of the receiver circuit 2 are the same as those explained hereinbefore, explanation thereof will be omitted.

As mentioned above, the driver circuit 1 in the embodiment shown in FIG. 8 has a function of the two-input NAND, but can be expanded to a general logic circuit having "n" inputs. For an "n"-input NAND, "n" PMOS transistors may be connected in parallel to each other between the power supply terminal $V_{DD}$ and the first output node G, and "n" NMOS transistors may be connected in series between the second output node J and the ground terminal. Similarly, for an "n"-input NOR, "n" PMOS transistors may be connected in series between the power supply terminal $V_{DD}$ and the first output node G, and "n" NMOS transistors may be connected in parallel between the second output terminal J and the ground terminal.

Figure 9:
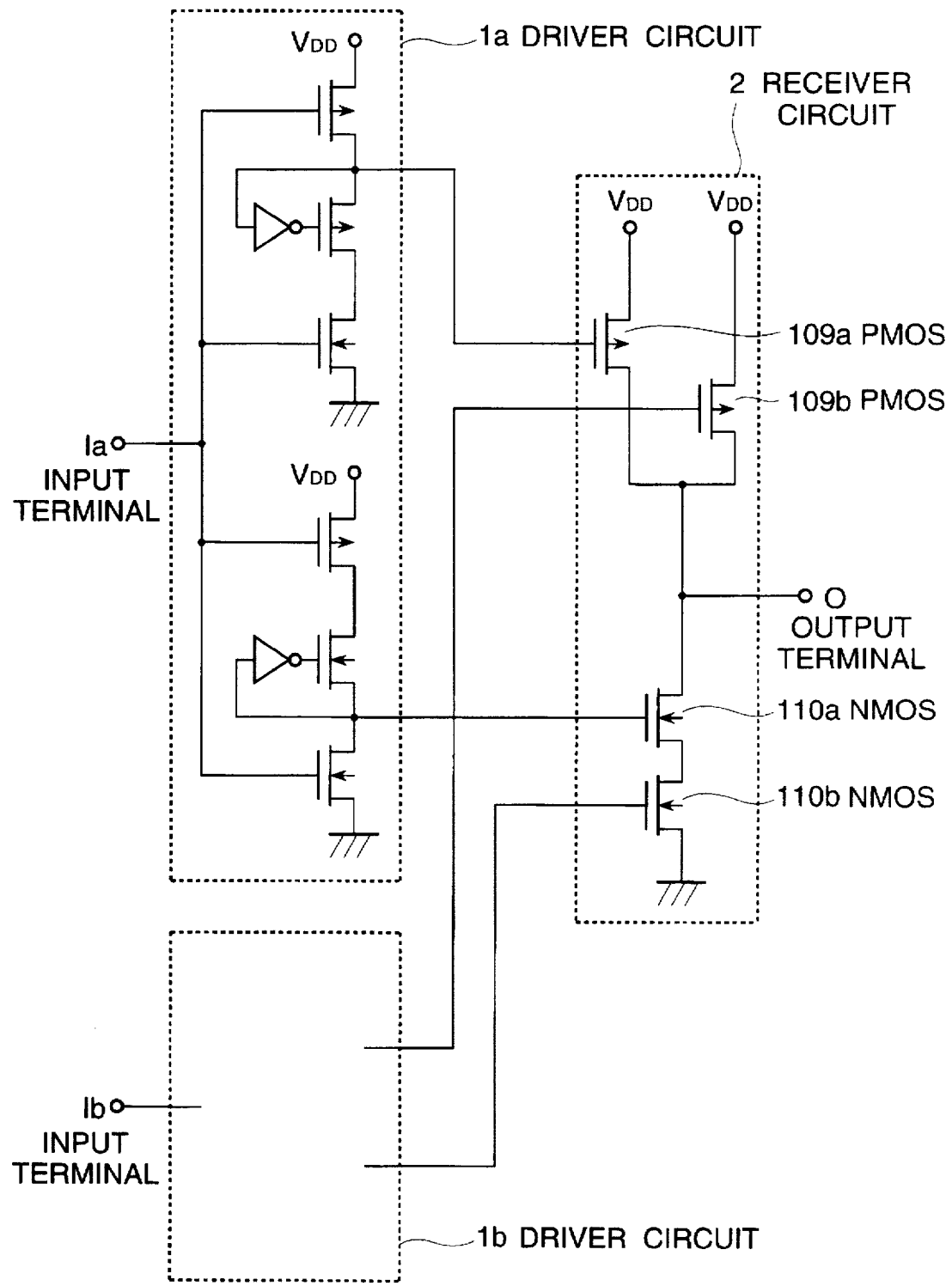
FIG. 9 is a circuit diagram of a sixth embodiment of the driver/receiver circuit in accordance with the present invention.

FIG. 9 shows a sixth embodiment. This embodiment includes a driver circuit 1a and a driver circuit 1b which have the same construction as that of the driver circuit 1 shown in FIG. 3 and explained hereinbefore, and which includes input terminals 1a and 1b, respectively. A receiver circuit 2 includes a PMOS 109a and a PMOS 109b connected in parallel to each other, each having its source and its drain connected to a power supply terminal $V_{DD}$ and an output terminal O, respectively, and an NMOS 110a and an NMOS 110b connected in series between a ground terminal and the output terminal O. A gate of the PMOS 109a is connected to a first output node of the driver circuit 1a, and a gate of the PMOS 109b is connected to a first output node of the driver circuit 1b. A gate of the NMOS 110a is connected to a second output node of the driver circuit 1a, and a gate of the NMOS 110b is connected to a second output node of the driver circuit 1b. In the circuit shown in FIG. 9, only when the output of the driver circuit 1a is at a high level (namely, the first output node of the driver circuit 1a is at a level equal to the potential of the power supply terminal $V_{DD}$ and the second output node of the driver circuit 1a is at an intermediate level) and the output of the driver circuit 1b is also at a high level (namely, the first output node of the driver circuit 1b is at a level equal to the potential of the power supply terminal $V_{DD}$ and the second output node of the driver circuit 1b is at an intermediate level), both of the PMOS 109a and the PMOS 109b are non-conductive, and both of the NMOS 110a and the NMOS 110b are conductive, so that the output terminal O of the receiver circuit 2 is brought to a low level, namely, to the ground level. In the other situations, at least one of the PMOS 109a and the PMOS 109b is conductive and at least one of the NMOS 110a and the NMOS 110b is non-conductive, so that the output terminal O of the receiver circuit 2 is brought to a high level, namely, to the potential of the power supply terminal $V_{DD}$. In other words, the receiver circuit 2 in the embodiment shown in FIG. 9 has a two-input NAND function.

In general, it is easy to expand the receiver circuit so as to have an "n"-input logic function. For realizing an "n"-input NAND function, respective first output nodes of "n" driver circuits may be connected to corresponding gates of "n" PMOS transistors connected in parallel to each other between the power supply terminal $V_{DD}$ and the output terminal in the receiver circuit, and respective second output nodes of the "n" driver circuits may be connected to corresponding gates of "n" NMOS transistors connected in series between the output terminal and the ground terminal in the receiver circuit. Similarly, to cause the receiver circuit to have an "n"-input NOR function, respective first output nodes of "n" driver circuits may be connected to corresponding gates of "n" PMOS transistors connected in series between the power supply terminal $V_{DD}$ and the output terminal of the receiver circuit, and respective second output nodes of the "n" driver circuits may be connected to corresponding gates of "n" NMOS transistors connected in parallel between the output terminal and the ground terminal of the receiver circuit.

Figure 1A:
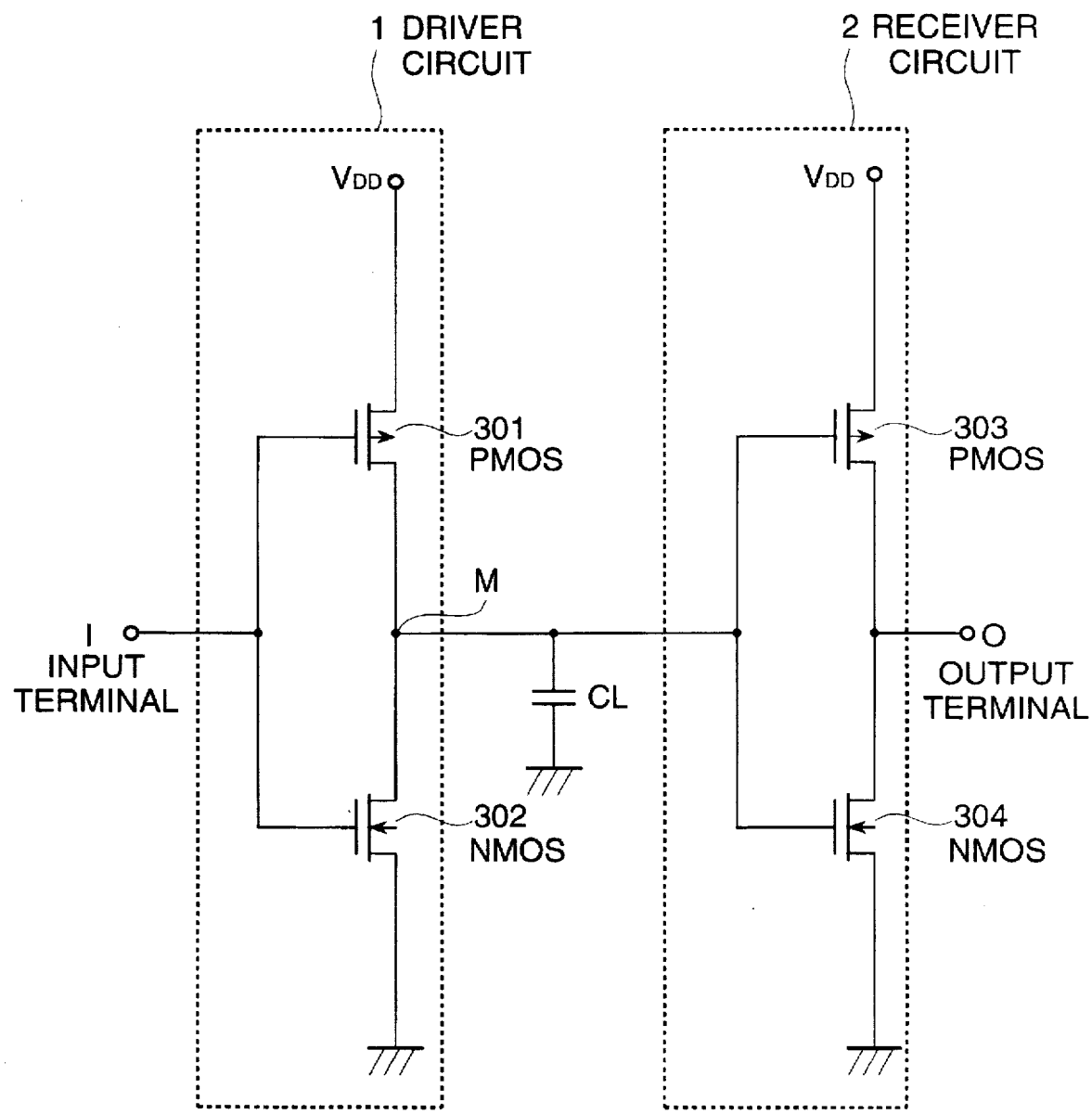
FIG. 1A is a circuit diagram of one example of the conventional driver/receiver circuit.
Figure 1B:
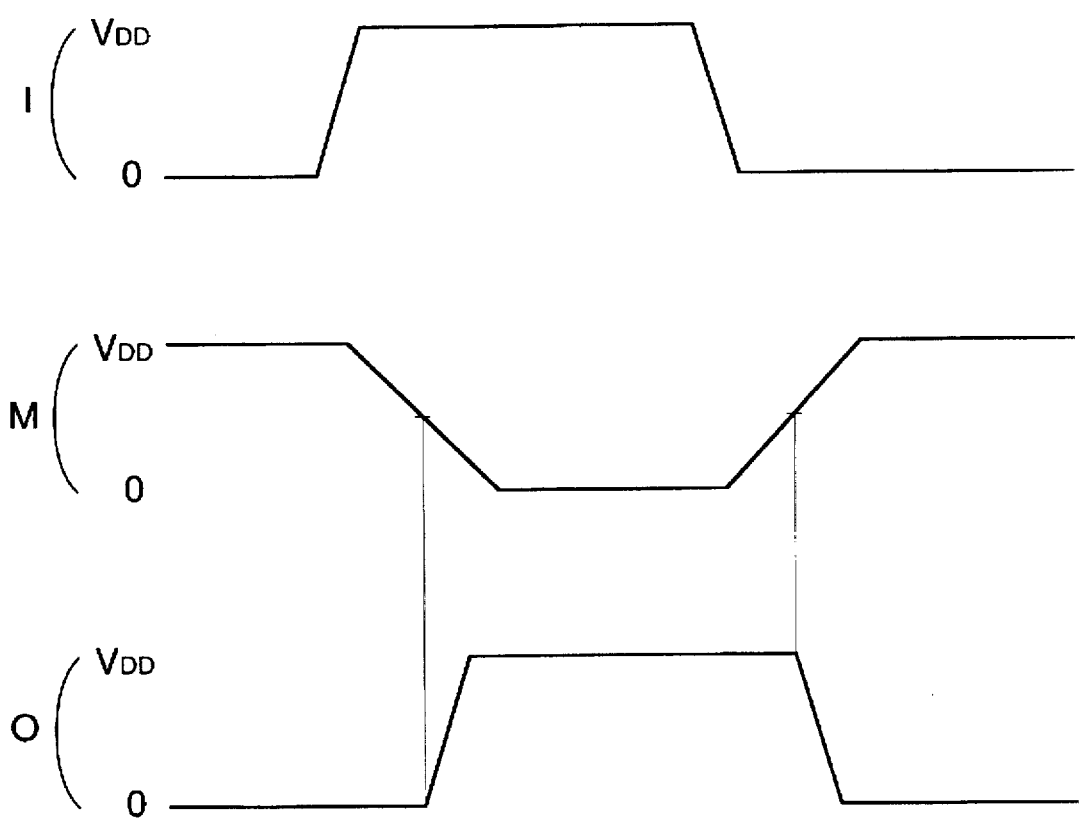
FIG. 1B is a timing chart illustrating an operation of the conventional driver/receiver circuit shown in FIG. 1A.
Figure 10:
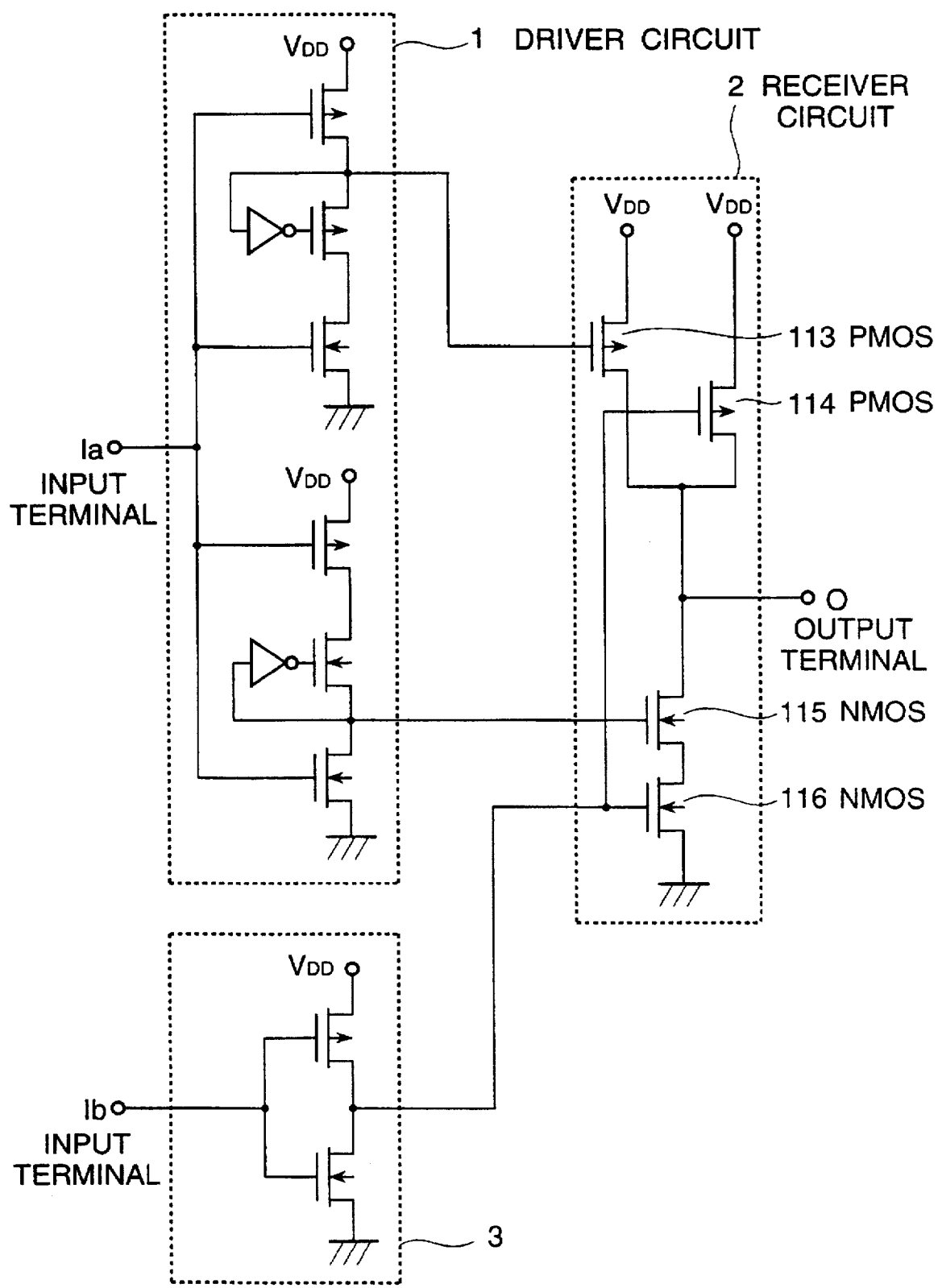
FIG. 10 is a circuit diagram of a seventh embodiment of the driver/receiver circuit in accordance with the present invention.

FIG. 10 shows a seventh embodiment, which includes, as the driver circuit, the driver circuit in accordance with the present invention shown in FIG. 3, and the conventional driver circuit shown in FIG. 1A, in a mixed fashion. In FIG. 10, a receiver circuit 2 includes a PMOS 113 and a PMOS 114 connected in parallel to each other between a power supply terminal $V_{DD}$ and an output terminal O, and an NMOS 115 and an NMOS 116 connected in series between a ground terminal and the output terminal O. A gate of the PMOS 113 is connected to the first output node of the driver circuit 1 of the present invention shown in FIG. 3, and a gate of the NMOS 115 is connected to the second output node of the driver circuit 1. Gate of the PMOS 114 and the NMOS 116 are connected to the output terminal of the CMOS circuit which constitutes the conventional driver circuit in the example shown in FIG. 1A. Also in the circuit shown in FIG. 10, only when the output of the driver circuit 1 is at a high level (namely, the first output node is at a level equal to the potential of the power supply terminal $V_{DD}$ and the second output node is at an intermediate level) and the output of the CMOS driver circuit is also at a high level (namely, at a level equal to the potential of the power supply terminal $V_{DD}$), both of the PMOS 113 and the PMOS 114 are non-conductive, and both of the NMOS 115 and the NMOS 116 are conductive, so that the output terminal O of the receiver circuit 2 is brought to a low level, namely, to the ground level. On the other hand, if there is fulfilled at least one of a first condition that the output of the driver circuit 1 is at a low level (namely, the first output node is at an intermediate level and the second output node is at the ground potential) and a second condition that the output of the CMOS driver circuit 3 is also at a low level (namely, the ground potential), at least one of the PMOS 113 and the PMOS 114 is conductive and at least one of the NMOS 115 and the NMOS 116 is non-conductive, so that the output terminal O of the receiver circuit 2 is brought to a high level, namely, to the potential of the power supply terminal $V_{DD}$.

As mentioned above, the receiver circuit shown in FIG. 10 has a two-input NAND function, but different from the receiver circuit shown in FIG. 9, in which the signal amplitude on the gates of the PMOS 113 and the NMOS 115 is small, a signal changing between the potential of the power supply terminal $V_{DD}$ and the ground potential is applied to the gates of the PMOS 114 and the NMOS 116. However, the receiver circuit shown in FIG. 10 operates as the circuit having the same two-input NAND function as that of the receiver circuit shown in FIG. 9. Accordingly, when a wiring connected between the driver circuit and the receiver circuit is long and therefore has a large wiring capacitance, the driver circuit 1 of the present invention is used to supply a signal to the receiver circuit, and when a wiring connected between the driver circuit and the receiver circuit is short and therefore has such a small wiring capacitance that a signal transmission delay does substantially not become a problem, the conventional driver circuit 3 is used to supply a signal to the receiver circuit 2. In this manner, the driver circuit of the present invention and the conventional driver circuit can be selectively used in the mixed manner, so that a logical operation such as NAND or NOR can be executed in a multi-input receiver circuit 2. Therefore, the circuit of the present invention is excellent in compatibility with the conventional CMOS circuit.

The receiver circuit of the embodiment shown in FIG. 10 can be expanded to an "n"-input receiver circuit in a similar manner to the embodiment shown in FIG. 9, except that the output of each conventional CMOS circuit is connected to both a gate of a PMOS to be connected to a driver circuit and a gate of an NMOS located at a connection position complementary to the PMOS. Therefore, it would be apparent that an "n"-input NAND function and an "n"-input NOR function can be easily realized.

As mentioned above, the driver/receiver circuit in accordance with the present invention is so constructed that the output signal of the driver circuit is composed of a first small amplitude output signal changing between the power supply potential and a first intermediate potential and a second small amplitude output signal in the same phase as that of the first small amplitude output signal and changing between a second intermediate potential and the ground potential, and these first and second small amplitude output signals are supplied to a PMOS and an NMOS in the receiver circuit. With this arrangement, it is possible to provide the driver/receiver circuit which can operate at a high speed with a small consumed electric power even if a large wiring capacitance exists between the driver circuit and the receiver circuit.

I claim:

1. A driver/receiver circuit comprising:
    a driver circuit having a power supply terminal, a ground terminal, an input terminal and first and second output nodes, the driver circuit for outputting, based on an input signal on said input terminal, on said first output node, a first output signal which changes between a power supply potential supplied to said power supply terminal and a first potential, and, on said second output node, a second output signal having the same phase as that of said first output signal and which changes between a second potential and a ground potential; and
    a receiver circuit including a first electric circuit having at least a P-channel MOSFET connected between said power supply terminal and an output terminal and having its gate electrically connected to said first output node, and a second electric circuit having at least an N-channel MOSFET connected between said ground terminal and said output terminal and having its gate electrically connected to said second output node, said second electric circuit having a configuration substantially similar to that of said first electric circuit,
    wherein said driver circuit includes:
        a P-channel MOSFET having its source connected to said power supply terminal, its gate connected to said input terminal, and its drain connected to said first output node,
        a first inverter circuit having its input connected to said first output node,
        a first voltage limiting MOSFET of a P-channel type having its source connected to said first output node and its gate connected to an output of said first inverter circuit,
        an N-channel MOSFET having its source connected to said ground terminal, its gate connected to said input terminal, and its drain connected to said second output node,
        a second inverter having its input connected to said second output node, and
        a second voltage limiting MOSFET of an N-channel type having its source connected to said second output node, its gate connected to an output of said inverter circuit, and its drain connected to a drain of said first voltage limiting MOSFET.

2. A driver/receiver circuit claimed in claim 1, wherein said driver circuit further includes:
    at least one additional input terminal;
    at least one additional P-channel MOSFET connected in parallel to said first P-channel MOSFET, between said power supply terminal and said first output node, and having its gate connected to said at least one additional input terminal; and
    at least one additional N-channel MOSFET connected in series to said first N-channel MOSFET, between said ground terminal and said second output node, and having its gate connected to said at least one additional input terminal.

3. A driver/receiver circuit claimed in claim 1, further including:
    a pull-up element comprising a P-channel MOSFET having its source connected to said power supply terminal, its gate connected to said ground terminal, and its drain connected to said first output node, and
    a pull-down element comprising an N-channel MOSFET having its source connected to said ground terminal, its gate connected to said power supply terminal and its drain connected to said second output node.

4. A driver/receiver circuit claimed in claim 1, wherein said receiver circuit includes:
    a P-channel MOSFET having its source connected to said power supply terminal, its gate connected to said first output node of said driver circuit, and its drain connected to said output terminal, and
    an N-channel MOSFET having its source connected to said ground terminal, its gate connected to said second output node of said driver circuit, and its drain connected to said output terminal.

5. A driver/receiver circuit claimed in claim 1, wherein said receiver circuit includes:
    a first electric circuit comprising a plurality of P-channel MOSFETs connected between said power supply terminal and said output terminal, and
    a second electric circuit comprising a plurality of N-channel MOSFETs connected between said ground terminal and said output terminal in a connection construction complementary to that of said first electric circuit, respective first output nodes of a plurality of driver circuits being connected to a gate of corresponding P-channel MOSFETs in said first electric circuit, and respective second output nodes of said plurality of driver circuits being connected to a gate of corresponding N-channel MOSFETs in said second electric circuit.

6. A driver/receiver circuit claimed in claim 1, wherein said receiver circuit includes:

a first electric circuit comprising a plurality of P-channel MOSFETs connected between said power supply terminal and said output terminal, and a second electric circuit comprising a plurality of N-channel MOSFETs connected between said ground terminal and said output terminal in a connection construction complementary to that of said first electric circuit, a gate of at least one P-channel MOSFET of said P-channel MOSFETs included in said first electric circuit and a gate of an N-channel MOSFET which is included in said second electric circuit and which is complementary to said at least one P-channel MOSFET, being electrically connected to said first output node and said second output node of said driver circuit, and a gate of another P-channel MOSFET of said P-channel MOSFETs included in said first electric circuit being connected to a gate of an N-channel MOSFET which is included in said second electric circuit and which is complementary to said another P-channel MOSFET, and also being connected to an output of at least one CMOS circuit connected between said power supply terminal and said ground terminal.

7. A driver/receiver circuit claimed in claim 2, wherein said receiver circuit includes:

a P-channel MOSFET having its source connected to said power supply terminal, its gate connected to said first output node of said driver circuit, and its drain connected to said output terminal, and an N-channel MOSFET having its source connected to said ground terminal, its gate connected to said second output node of said driver circuit, and its drain connected to said output terminal.

8. A driver/receiver circuit claimed in claim 2, wherein said receiver circuit includes:

a first electric circuit comprising a plurality of P-channel MOSFETs connected between said power supply terminal and said output terminal, and a second electric circuit comprising a plurality of N-channel MOSFETs connected between said ground terminal and said output terminal in a connection construction complementary to that of said first electric circuit, respective first output nodes of a plurality of driver circuits being connected to a gate of corresponding P-channel MOSFETs in said first electric circuit, and respective second output nodes of said plurality of driver circuits being connected to a gate of corresponding N-channel MOSFETs in said second electric circuit.

9. A driver/receiver circuit claimed in claim 2, wherein said receiver circuit includes:

a first electric circuit comprising a plurality of P-channel MOSFETs connected between said power supply terminal and said output terminal, and a second electric circuit comprising a plurality of N-channel MOSFETs connected between said ground terminal and said output terminal in a connection construction complementary to that of said first electric circuit, a gate of at least one P-channel MOSFET of said P-channel MOSFETs included in said first electric circuit and a gate of an N-channel MOSFET which is included in said second electric circuit and which is complementary to said at least one P-channel MOSFET, being electrically connected to said first output node and said second output node of said driver circuit, and a gate of another P-channel MOSFET of said P-channel MOSFETs included in said first electric circuit being connected to a gate of an N-channel MOSFET which is included in said second electric circuit and which is complementary to said another P-channel MOSFET, and also being connected to an output of at least one CMOS circuit connected between said power supply terminal and said ground terminal.

10. A driver/receiver circuit claimed in claim 5, wherein said plurality of P-channel MOSFETs in said first electric circuit have a parallel-connection with respect to one another and said plurality of N-channel MOSFETs in said second electric circuit have a series-connection with respect to one another.

11. A driver/receiver circuit claimed in claim 6, wherein said plurality of P-channel MOSFETs in said first electric circuit have a parallel-connection with respect to one another, and said plurality of N-channel MOSFETs in said second electric circuit have a series-connection with respect to one another.

12. A driver/receiver circuit claimed in claim 8, wherein said plurality of P-channel MOSFETs in said first electric circuit have a parallel-connection with respect to one another, and said plurality of N-channel MOSFETs in said second electric circuit have a series-connection with respect to one another.

13. A driver/receiver circuit claimed in claim 9, wherein said plurality of P-channel MOSFETs in said first electric circuit have a parallel-connection with respect to one another, and said plurality of N-channel MOSFETs in said second electric circuit have a series-connection with respect to one another.

* * * * *